United States Patent [19]

Burley

[11] Patent Number: 4,698,817
[45] Date of Patent: Oct. 6, 1987

[54] PEAK OPTICAL POWER CONTROL CIRCUIT FOR LASER DRIVER

[75] Inventor: Gregory S. Burley, Edmonton, Canada

[73] Assignee: Northern Telecom Limited, Montreal, Canada

[21] Appl. No.: 706,686

[22] Filed: Feb. 28, 1985

[51] Int. Cl.[4] .............................................. H01S 3/13
[52] U.S. Cl. ...................................... 372/31; 372/38; 372/33
[58] Field of Search ....................... 372/38, 28, 32, 26, 372/29, 31

[56] References Cited

U.S. PATENT DOCUMENTS

| | | | |
|---|---|---|---|
| 3,898,583 | 8/1975 | Shuey | 372/29 |
| 4,009,385 | 2/1977 | Sell | 372/29 |
| 4,243,951 | 1/1981 | Wolkstein et al. | 372/38 |
| 4,344,173 | 10/1982 | Straus | 372/29 |
| 4,355,395 | 10/1982 | Satter et al. | 372/38 |

Primary Examiner—Léon Scott, Jr.
Attorney, Agent, or Firm—Thomas Adams

[57] ABSTRACT

To compensate for variations in a laser's peak power output due to changes in slope efficiency, a feedback loop is provided to monitor light output and effect compensatory changes in the drive current. In the feedback loop, the light output is detected by a photodiode. The output of the photodiode is filtered by a bandpass filter. The mean power of the filtered signal is determined and compared with a reference to control the laser drive. The reference takes account of the relationship between the filtered signal power and the peak power in the frequency spectrum of the pseudo-random input signal. The use of this reduced-bandwidth signal allows a relatively cheap, low bandwidth photodiode to be used with a long-wavelength laser.

8 Claims, 4 Drawing Figures

PEAK OPTICAL POWER CONTROL CIRCUIT FOR LASER DRIVER

The invention relates to a method and apparatus for controlling an injection laser and in particular to stabilizing the output of a semiconductor laser to compensate for changes due to temperature changes and device aging. The invention is especially, but not exclusively, applicable to so-called long-wavelength semiconductor lasers which operate, for example, at 1.3 micrometers rather than the 850 nanometers or less of so-called short-wavelength lasers.

The light output/applied current characteristic of a typical laser has a threshold current $I_{th}$ below which only spontaneous light emission takes place. Once the threshold current is exceeded, the laser enters its lasing mode and light output increases rapidly and approximately linearly. In operation, the laser diode is usually biased by applying a D.C. bias current to a level just below the threshold current $I_{th}$. The alternating drive current, modulated by the signal to be transmitted, drives the laser diode beyond the threshold level to turn it on.

Problems arise due to variation in the threshold level due to temperature changes and device aging; this has a direct effect on the mean power output of the laser. As well, device aging and temperature changes cause changes in the slope of the light output/applied current characteristic above the threshold value. This slope affects the peak power output of the laser. Long-wavelength lasers are much more sensitive to this variation in slope efficiency than short-wavelength laser diodes.

It has been proposed to compensate for such variations by monitoring the output of the laser and, using one or more feedback loops, adjusting the bias and/or drive circuits to restore the output to predetermined levels. For example, U.S. patent Specification No. 4,355,395, entitled "Injection Lasers", issued Oct. 19 1982 to S. R. Salter et al, which is incorporated herein by reference, discloses a stabilization arrangement in which the minimum output level of the laser is monitored and used to control bias current to stabilize the threshold. Also disclosed is a peak monitoring circuit which detects peak output power of the laser and controls the modulating drive current.

Salter et al specifically disclose a relatively low speed system (8 Mbits/sec.) and a higher speed system (140 Mbits/sec). In both cases, the light output directly from the front face of the laser is monitored using a semi-reflecting member and a photodiode. They suggest, without disclosing in detail, that the photodiode could monitor light from the back face of the laser.

In such known systems the photodiode would be selected to have a bandwidth comparable with the signal to be transmitted by the laser. This allows a simple peak-detection circuit to be used to control the peak optical power. Also, for a low speed system, a low cost, widely-available Germanium photodiode can be used. However, in designing a practical high speed laser system, I have found that problems arise which apparently were not foreseen by Salter et al. In particular, photodiodes with a bandwidth great enough to handle/detect a 135 Mbit/sec. return-to-zero digital signal tend to be difficult to make. Gallium arsenide photodiodes have sufficient bandwidth, but they are expensive and not widely available.

The present invention seeks to overcome these problems. According to the present invention apparatus for controlling the peak power of the light output of an injection laser comprises:

drive means for applying drive current to said laser to modulate its light output in dependence upon an input signal having a predetermined power spectrum;

detection means for detecting light output from said laser and providing a corresponding signal;

filter means for filtering said corresponding signal to provide a filtered signal having a bandwidth significantly less than that of the laser output signal;

peak optical power detection mean for responding to said filtered signal to provide a signal proportional to the peak amplitude of said light output; and comparator means for comparing said proportional signal with a reference that is predetermined relative to said input signal for controlling said drive means to vary of said modulating drive current and control the peak output power of said laser.

Such a monitoring arrangement allows a detector, e.g. a photodiode, to be used which has a much lower bandwidth than the input signal and hence insufficient to be used as a straightforward peak detector. Conveniently, the peak optical power detection means responds to the mean power within the narrow spectrum of the filtered signal.

An embodiment of the invention will now be described, by way of example only, with reference to the accompanying drawings, in which.

Figure 1:
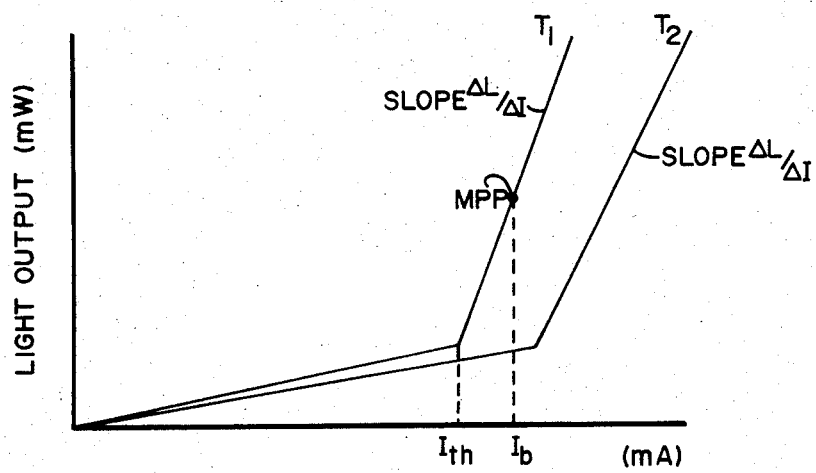
FIG. 1 is a graphical representation of the lasing light output/applied current characteristic of a semiconductor injection laser.

In FIG. 1, curve $T_1$ represents the light output/applied current characteristic of an injection laser diode. As previously mentioned, when the applied current is less than the threshold $I_{th}$ only spontaneous light emission occurs. When the applied current is above the threshold $I_{th}$ the laser diode will lase. The corresponding part of the light output/applied current characteristic has an approximately uniform slope $L/I$ which determines the efficiency of the injection laser. Curve $T_2$ shows the effects of temperature changes and aging on the injection laser. The position of the threshold $I_{th}$ changes, both with temperature and aging, as also does the slope efficiency, $L/I$. The latter is especially marked in so-called long wavelength lasers, having a wavelength of, say, 1.3 micrometers, such as are used in high speed digital transmission systems. Generally, variation in the threshold affects the mean power output from the laser, while variation in the slope efficiency affects the peak output power.

The present invention is concerned with stabilizing the peak output power against changes due to temperature and/or aging. Before describing the specific embodiment of the invention, the principles upon which it is based will be described with reference to FIG. 2. The frequency spectrum shown there is for a pseudo-random 135 MHz digital return-to-zero signal. Although not specifically shown as such, the spectrum is actually a line spectrum with an envelope which takes the form sin x/x. The sin x/x envelope results from transmitting square-wave pulses. The spectrum can be considered as continuous if there are enough lines in the band of interest. For example, approximately 8,000 lines between D.C. and 270 MHz would be considered sufficient and could be provided by a 13 bit "scrambler" producing a $2^{13}-1$ bit pattern.

The magnitude P of the frequency spectrum (at the low frequency end) is predetermined by the statistics of the pseudo-random digital signal, and the characteristics of the transmitted pulses, including the pulse amplitude. Consequently, by measuring the power spectrum within only a narrow band of frequencies, say between 1 MHz and 5 MHz, it is possible to obtain a measure of the magnitude P and hence of the peak power of the pulses in the digital signal emanating from the laser.

Providing the digital pulses appear in a "random", in practice pseudo-random, sequence, and thus provide the predetermined power spectrum, it is permissible to detect power within the narrow band of the spectrum and provide a corresponding D.C. signal proportional to the amplitude of the digital optical pulses.

Figure 3:
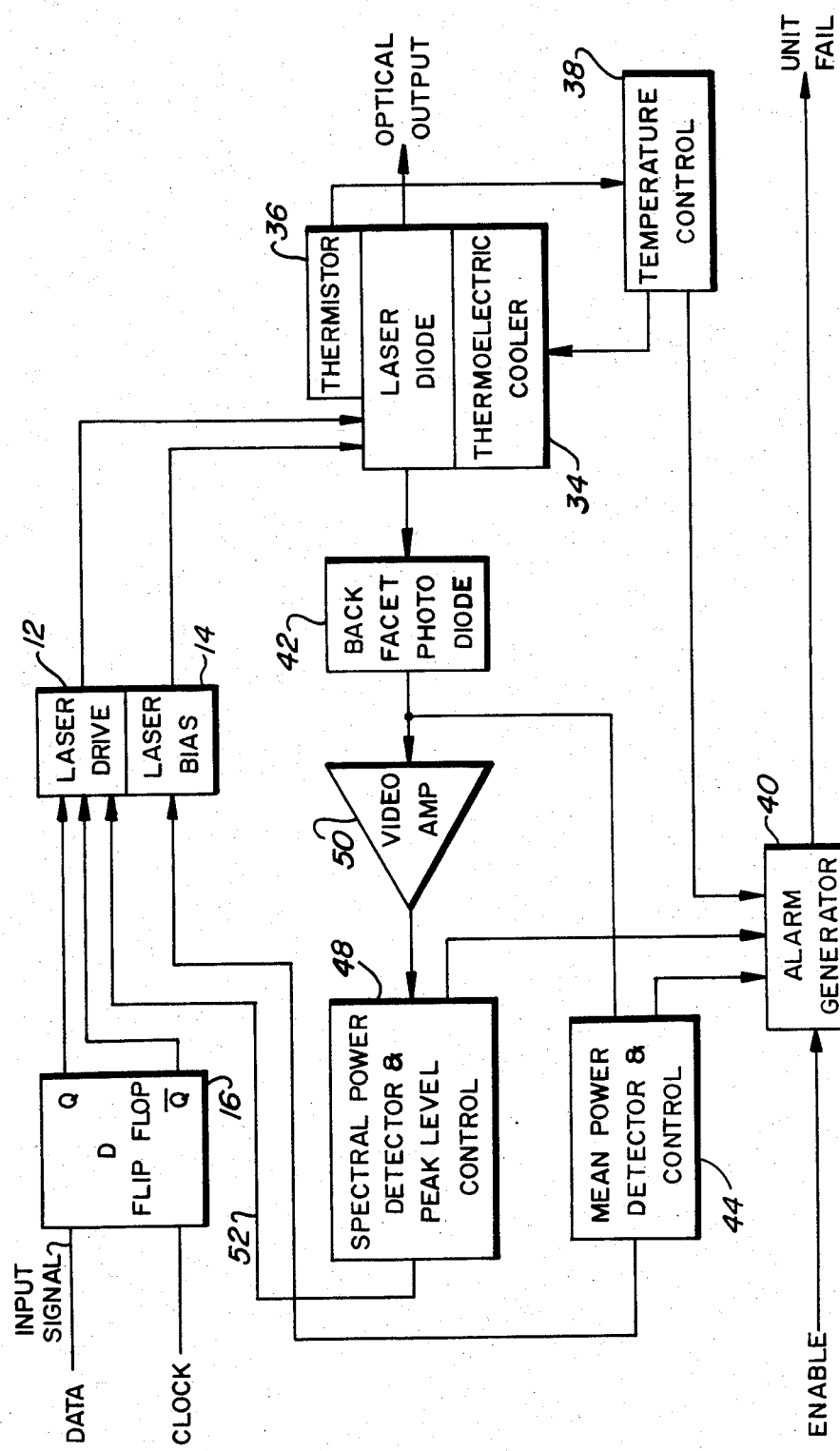
FIG. 3 is a block schematic diagram of an injection laser and apparatus for controlling its light output.
Figure 4:
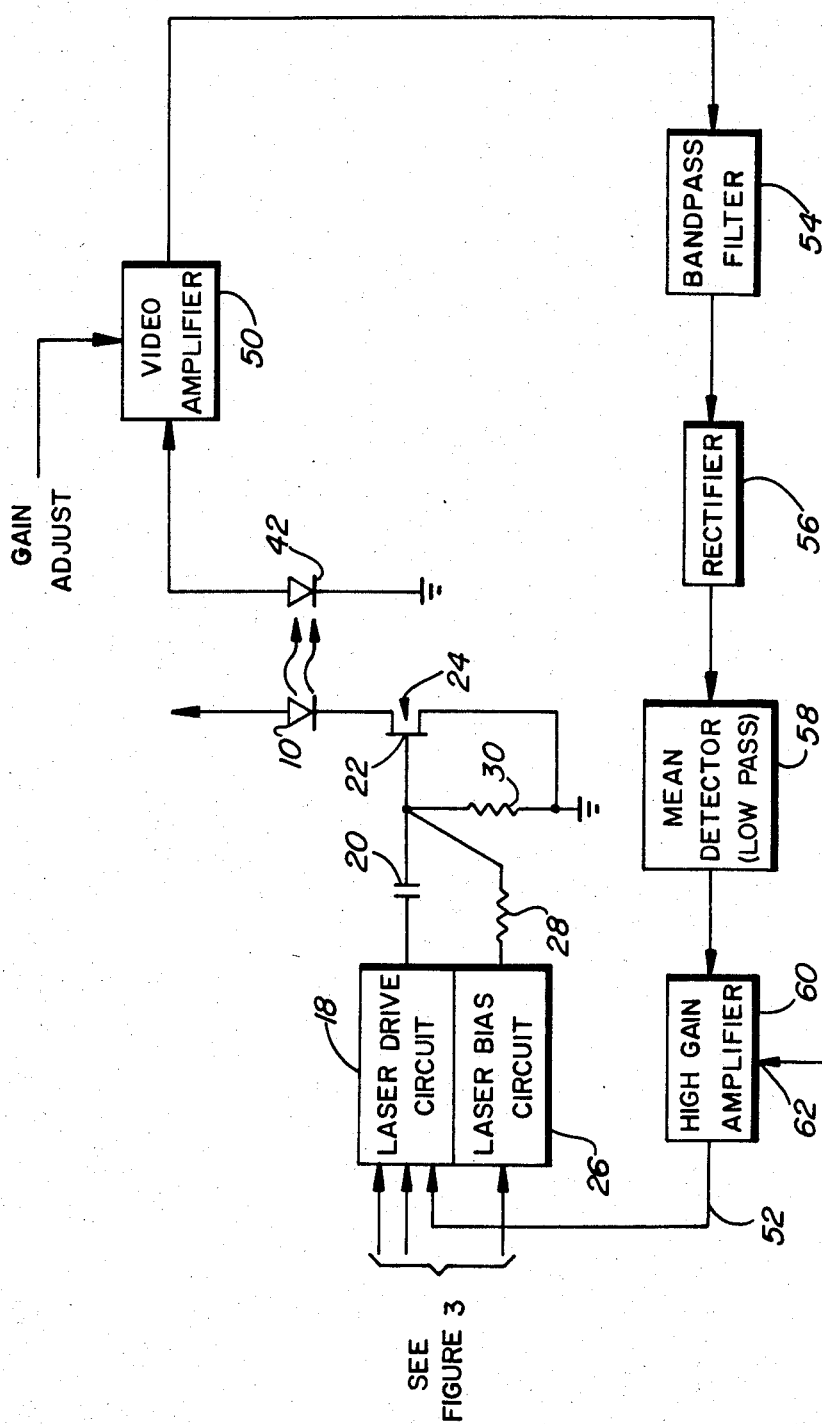
FIG. 4 is a more detailed block schematic diagram showing a feedback loop for stabilizing the amplitude of the output signal of the laser.

Specific implementation of such a stabilization arrangement will now be described with reference to FIGS. 3 and 4.

Figure 2:
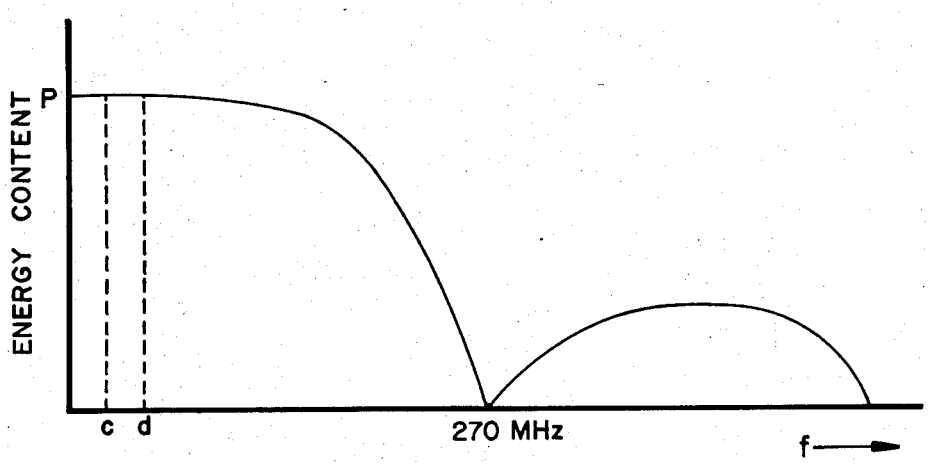
FIG. 2 is a graphical representation of the power/frequency spectrum of the output of the laser when driven by a pseudo-random digital signal.

A laser diode 10, capable of operation at 135 Mbit/sec., has drive current supplied by means of laser drive means 12 and bias current supplied by bias means 14. The laser drive means 12 receives the input signal by way of a flip-flop 16. The input signal is a 135 MHz pseudo-random return-to-zero digital signal having a frequency spectrum as illustrated in FIG. 2. As shown in FIG. 4, the laser drive means 10 comprises a laser drive circuit 18 (of known contruction) A.C. coupled by means of a capacitor 20 to the gate 22 of a gallium arsenide field effect transistor (GaAs FET) 24. The drain of the GaAs FET 24 is coupled to the cathode of the laser diode 10 and its source is grounded. The GaAs FET, which is biased into its linear region by the laser bias current, operates as a linear voltage controlled current source.

The laser bias means 14 comprises a laser bias circuit 26 (generally of known form) coupled to the gate 22 of the GaAs FET 24 by a resistor 28. A second resistor, 30, couples the gate 22 to ground so that the two resistors, 28 and 30, form a resistive divider.

Since the GaAs FET is operated as a voltage controlled current source, the D.C. voltage at the gate 22 produced by the resistive divider, 28, 30, produces a D.C. current through the GaAs FET. This is identical to the laser bias current $I_b$, which flows through the laser diode 10. As can be seen from FIG. 1, bias current $I_b$ is greater than the threshold current $I_{th}$ and corresponds to the mean power point (MPP). This biasing level is determined by a preset (not shown) in the laser bias control circuit 26. The biasing level and the drive current from drive means 12 are so arranged that a digital "1" drives the laser output to peak optical power and a digital zero drives it to below threshold.

Laser diode 10 is provided with a temperature control arrangement including a thermoelectric cooler 34, thermistor 36 and control 38 connected in a feedback loop. Variations in the temperature of the laser 10 are detected by the thermistor 36, compared with a reference by the control 38 and compensated for by the thermoelectric cooler 34 which is actuated in response to the output of control 38. The temperature control 38 also provides an output to an alarm generator 40 so as to signal if excessive temperatures occur.

Although such a temperature control will keep the temperature of a laser diode 10 substantially constant, laser threshold and laser efficiency variations due to device aging will still occur. The effects of these variations are mitigated by two feedback loops coupled to a photodiode 42 mounted upon the back facet of the laser diode 10. One of those feedback loops comprises mean power detection and control means 44 which compares the D.C. output of the photodiode 42 with a reference (not shown) and applies a corresponding bias control signal to laser bias means 14. Laser bias means 14 adjusts the bias current $I_b$ in dependence upon the bias control signal to maintain the bias current, and hence the mean optical power output, substantially constant.

The second feedback loop comprises peak optical power level control means 48, which receives the A.C. output of the photodiode 42 by way of a video amplifier 50 and supplies a drive control signal on line 52 to the laser drive means 12. The component parts of the peak optical power detector and peak level control means 48 are shown in FIG. 4 and comprise, in series, a bandpass filter 54, rectifier 56, mean detector 58 and high gain amplifier 60, the latter having a differential input 62 coupled to a preset reference.

In the preferred embodiment the photodiode 42 is a "low" bandwidth photodiode, conveniently of Germanium, and has a bandwidth of about 10 MHz. To reduce the effects of variations in bandwidth due to manufacturing tolerances, the bandpass filter 54 has a passband which is even less, from 1 MHz to 5 MHz.

For a nominal bandwidth of 10 MHz, the risetime of the photodiode is approximately 50 nanoseconds. The specified 135 Mbit/sec. return-to-zero signal has a pulse width of 3.5 nanoseconds. If the photodiode were to be used as a peak detector, approximately fifteen pulses would be needed for the peak detector to integrate up to peak level. That is, a pulse train of 50 nanoseconds duration would be required. Statistics of data transmission show that it is rare for fifteen 1's to occur in a row.

Accordingly, the output of the bandpass filter 54 is rectified to produce a D.C. component from the A.C. signal and is mean-detected by mean detector 58 which conveniently comprises a lowpass filter in order to extract the same D.C. component. The output of the mean detector 58 is compared with a preset reference by amplifier 60 and the difference or error signal applied to the laser drive circuit to adjust its gain so as to maintain the peak optical power substantially constant. The preset reference is adjusted for a desired output signal and then fixed.

An advantage of embodiments of the invention is that they allow low bandwidth, widely-available, inexpensive photodiodes to be used.

What is claimed is:

1. Apparatus for controlling the peak power of a light output signal of an injection laser, comprising:
   drive means for applying a drive current to said laser to modulate its light output in dependence upon an input signal having a predetermined power spectrum;
   detection means for detecting light output from said laser and providing a corresponding signal;
   filter means for filtering said corresponding signal to provide a filtered signal having a bandwidth significantly less than that of said laser output signal;

peak optical power detection means for responding to the filtered signal to provide a signal proportional to the peak amplitude of said laser output signal; and comparator means for comparing such proportional signal with a reference that is predetermined relative to said predetermined power spectrum and in dependence upon such comparison controlling said drive means to vary said modulating drive current and control said peak power of said laser.

2. Apparatus as claimed in claim 1, wherein;

said peak optical power detection means serves to respond to mean power of said filtered signal for providing said signal proportional to the peak amplitude of said laser output signal.

3. Apparatus as claimed in claim 1, wherein said detection means comprises a photodiode having a bandwidth significantly less than the bandwidth of said input signal.

4. Apparatus as claimed in claim 3, wherein said filter means has a bandwidth significantly less than the bandwidth of said photodiode.

5. Apparatus as claimed in claim 1 further comprising means for detecting and controlling mean power output of the injection laser.

6. Apparatus as claimed in claim 1, further comprising biasing means for applying a direct current bias to said laser.

7. Apparatus as claimed in claim 6 wherein said drive means comprises a gallium arsenide field effect transistor (GaAs FET), and said biasing means arranged to bias said GaAs FET to its mean power point, said drive means being controlled such that a digital one in said input signal drives the laser output signal to its peak optical power level and a digital zero drives the laser output signal to a level below its threshold.

8. Apparatus as claimed in claim 1, wherein said input signal is pseudo-random.

* * * * *